(12) United States Patent
Kimura

(10) Patent No.: US 6,268,652 B1
(45) Date of Patent: Jul. 31, 2001

(54) CSP TYPE SEMICONDUCTOR DEVICE WITH REDUCED PACKAGE SIZE

(75) Inventor: Naoto Kimura, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/144,345

(22) Filed: Aug. 31, 1998

(30) Foreign Application Priority Data

Sep. 26, 1997 (JP) .................................................. 9-262106

(51) Int. Cl.[7] .......................... H01L 23/13; H01L 23/495; H01L 23/28
(52) U.S. Cl. .......................... 257/696; 257/666; 257/698; 257/693; 257/676; 257/684; 257/797; 257/738; 257/737; 257/692
(58) Field of Search .................................. 257/690–693, 257/676, 696, 698, 666, 684, 797, 734, 737, 738

(56) References Cited

U.S. PATENT DOCUMENTS

| | | | |
|---|---|---|---|
| 5,327,009 | * 7/1994 | Igeta ...................................... | 257/666 |
| 5,436,500 | * 7/1995 | Park et al. ............................. | 257/696 |
| 5,559,305 | * 9/1996 | Lee et al. .............................. | 257/673 |
| 5,770,888 | * 6/1998 | Song et al. ............................ | 257/696 |
| 5,780,925 | * 7/1998 | Cipolla et al. ........................ | 257/676 |
| 5,886,404 | * 3/1999 | You ....................................... | 257/692 |
| 5,942,794 | * 8/1999 | Okumura et al. .................... | 257/666 |
| 5,949,416 | * 10/1999 | Kim ..................................... | 257/692 |
| 5,963,433 | * 10/1999 | Kim ..................................... | 257/696 |
| 5,969,416 | * 10/1999 | Kim ..................................... | 257/692 |
| 5,976,912 | * 11/1999 | Fukutomi et al. .................... | 438/110 |
| 5,977,616 | * 11/1999 | Schoenfeld et al. ................. | 257/666 |
| 5,999,413 | * 12/1999 | Ohuchi et al. ....................... | 257/684 |
| 6,028,356 | * 2/2000 | Kimura ................................ | 257/730 |
| 6,043,430 | * 3/2000 | Chun .................................... | 257/693 |
| 6,054,754 | * 4/2000 | Bissey .................................. | 257/666 |
| 6,060,775 | * 5/2000 | Ano ...................................... | 257/693 |
| 6,107,677 | * 8/2000 | Schoenfeld et al. ................. | 257/666 |

* cited by examiner

Primary Examiner—Alexander O. Williams
(74) Attorney, Agent, or Firm—Young & Thompson

(57) ABSTRACT

In a CSP type semiconductor device and a manufacturing method thereof, each pad on a semiconductor chip is connected to an end part of a lead through wire bonding which is mechanicalLy bent to form a bending part, each end part is shifted toward the semiconductor chip, and a mold resin is applied on the above constituents.

8 Claims, 9 Drawing Sheets

CSP TYPE SEMICONDUCTOR DEVICE WITH REDUCED PACKAGE SIZE

BACKGROUND OF THE INVENTION

The present invention relates to a CSP (chip size package) type semiconductor device and manufacturing methods thereof, particularly with respect to the CSP type semiconductor device having a COL (chip only lead)-BGA (ball grid array) configuration.

DESCRIPTION OF THE RELATED ART

As can be seen in FIG. 1A and FIG. 1B, with respect to a conventional CSP type semiconductor device, leads 30 are attached to the back side of a semiconductor chip 60A by an adhesive insulating tape 70A, each lead 30 being connected to a bonding pad 50 on the surface of the semiconductor chip 60A by a wire 90. The above elements are sealed by a mold resin 110A. Furthermore, each lead 30 is connected to a solder ball 120. Reference numeral 40 indicates a suspension pin.

The conventional CSP type semiconductor device as described above includes a COL, structure and a BGA structure.

According to the conventional CSP type semiconductor device having the COL-BGA structure as shown in FIG. 1A and FIG. 1B, in connecting the bonding pad 50 of the semiconductor chip and the lead 30 by the wire 90, the connecting point of the lead 30 and the wire 90 has to keep a certain distance from the semiconductor chip 60A, so that a capillary 130 of a wire bonding device would not touch the semiconductor chip 60A, as in the manner shown in FIG. 2. The distance between the connecting point of the lead and the wire is determined by a distance between a side of the semiconductor chip 60A and the wire 90, and dimensions and a margin of the capillary 130. The distance, for example, has to be between 250 µm–300 µm. Moreover, the connecting point of the wire 90 and the lead 30 has to be included within the mold resin 110A, in order to secure moisture resistance.

With respect to the conventional CSP type semiconductor device, not to mention, its external shape dimensions have to be maintained within a certain permissible range of value. Furthermore, the distance of the side of the semiconductor chip and the side of the mold resin at one side has to be kept 1 mm or below. Provided that the burr size of the mold resin is about 200 µm, the dimensions of the semiconductor chip are in error by ±50 µm, and positional shifts of a semiconductor chip at a time of mounting or at a time of wire bonding are indispensable, the thickness of the mold resin in view of the connecting point of the wire 90 and the lead 30 becomes considerably thin. Moreover, in the vicinity of the connecting point, an end part of the lead 30 is exposed from the mold resin 110A. Accordingly, it is difficult to maintain moisture resistance or excess moisture tolerance under such circumstances.

SUMMARY OF THE INVENTION

It is therefore an object of the present invention to provide a CSP type semiconductor device and manufacturing methods thereof, the CSP type semiconductor device being suitable in improving moisture resistance or excess moisture tolerance.

According to a first aspect of the present invention, there is provided a CSP type semiconductor device comprising: a semiconductor chip forming an electronic circuit on a main surface thereof and a plurality of terminals, i.e. first pads and second pads; an insulating tape being attached to the back side of the main surface of the semiconductor chip; first leads and second leads each of them being arranged in parallel beneath the back side of the semiconductor chip while the insulating tape is placed between themselves and the semiconductor chip; first wires and second wires connecting the first pads and the second pads to the first leads and the second leads, respectively; and a mold resin sealing the above components with respect to certain portions, the first leads passing through underneath the semiconductor chip, stretching from a first side of the mold resin toward a second side of the same although not touching it, forming first end parts at tips thereof, the first end parts connecting to the first wires, the second leads passing through underneath the semiconductor chip, stretching from the second side of the mold resin toward the first side of the same although not touching it, forming second end parts at tips thereof, the second end parts connecting to the second wires, the first leads and the second leads connecting to first conductive balls and second conductive balls, respectively, the first and the second conductive balls penetrating through the mold resin.

With respect to the first aspect of the invention, it can be arranged such that the whole of the first leads and the second leads are positioned lower than where a plane including the back side of the semiconductor chip is, and that the first end parts and the second end parts bond with the first wires and the second wires, respectively. Furthermore, it can also be arranged such that each of the first leads and the second leads is bent toward the main surface of the semiconductor chip after passing underneath the semiconductor chip, and that the first end parts and the second end parts of the leads are connected to the first wires and the second wires, respectively, by soldering.

According to a second aspect of the present invention, there is provided a method of manufacturing a CSP type semiconductor device, comprising the steps of: preparing a lead frame including a first frame and a second frame which are parallel to each other, a first tie-bar and a second tie-bar each of which connecting the first frame and the second frame together, first leads branching from the first tie-bar and stretching toward the second tie-bar, having their tips forming first end parts, second leads branching from the second tie-bar and stretching toward the first tie-bar, having their tips forming second end parts, first suspension pins branching from the first frame, and second suspension pins branching from the second frame; applying an insulating tape at the back side of the semiconductor chip to have the semiconductor chip be attached to the first suspension pins and the second suspension pins of the lead frame by applying insulating adhesive materials, the main surface of the semiconductor chip forming an electronic circuit and a plurality of terminals thereof, i.e. first pads and second pads; executing wire bonding for connecting the first pads and the second pads with the first end parts and the second end parts by first wires and second wires, respectively; shifting the first end parts and the second end parts toward the semiconductor chip by mechanically deforming a certain portion of each first lead at the side of the first tie-bar, and a certain portion of each second lead at the side of the second tie-bar; forming a mold resin for sealing the first leads, the second leads, the first suspension pins and the second suspension pins, with respect to certain portions thereof arranged in the vicinity of the semiconductor chip, together with the first wires, the second wires, and the semiconductor chip; selectively removing the mold resin so as to expose the first leads and the second leads thus forming first conductive balls and second conductive balls; and cutting off the first leads, the second leads, the first suspension pins, and the second suspension pins from the first tie-bar, the second tie-bar, the first frame, and the second frame, respectively.

According to a third aspect of the present invention, there is provided a method of manufacturing a CSP type semiconductor device, comprising the steps of: preparing a lead frame including a first frame and a second frame which are parallel to each other, a first tie-bar and a second tie-bar each of which connecting the first frame and the second frame together, first leads branching from the first tie-bar and stretching toward the second tie-bar while bending near the end toward the first tie-bar, having their tips forming first end parts, second leads branching from the second tie-bar and stretching toward the first tie-bar while bending near the end toward the second tie-bar, having their tips forming second end parts, first suspension pins branching from the first frame, and second suspension pins branching from the second frame; applying an insulating tape at the back side of the semiconductor chip with respect to a portion in between the first end parts and the second end parts, so as to have the semiconductor chip be attached to the first suspension pins and the second suspension pins of the lead frame by applying insulating adhesive material s, the main surface of the semiconductor chip forming an electronic circuit and a plurality of terminals thereof, i.e. first pads and second pads; executing wire bonding for connecting the first pads and the second pads with the second tie-bar and the first tie-bar, respectively, through first wires passing over the first end parts and second wires passing over the second end parts; soldering up the first wires and the second wires with the first end parts and the second end parts, respectively; cutting off the first wires and the second wires from soldered joints of the first wires and the first end parts and soldered joints of the second wires and the second end parts, respectively, so as to have the first wires separated from the second tie-bar and the second wires separated from the first tie-bar; forming a mold resin for sealing the first leads, the second leads, the first suspension pins and the second suspension pins, with respect to certain portions thereof arranged in the vicinity of the semiconductor chip, together with the first wires, the second wires, and the semiconductor chip; selectively removing the mold resin so as to expose the first leads and the second leads and form first conductive balls and second conductive balls; and cutting off the first leads, the second leads, the first suspension pins, and the second suspension pins from the first tie-bar, the second tie-bar, the first frame, and the second frame, respectively.

According to the above aspects of the invention, it is possible to draw the connecting points of the leads and the wires nearer toward the semiconductor chip by either moving the leads after having them bonded with the wires, or by bonding the wires with the tie-bars, provided that the leads are being bent beforehand, after which having the wires connected to the leads.

BRIEF DESCRIPTION OF THE DRAWINGS

The above and further objects and the novel feature of the invention will more fully appear from the following detailed description when the same is read in connection with the accompanying drawings, in which.

DESCRIPTION OF THE PREFERRED EMBODIMENTS

Figure 1A:
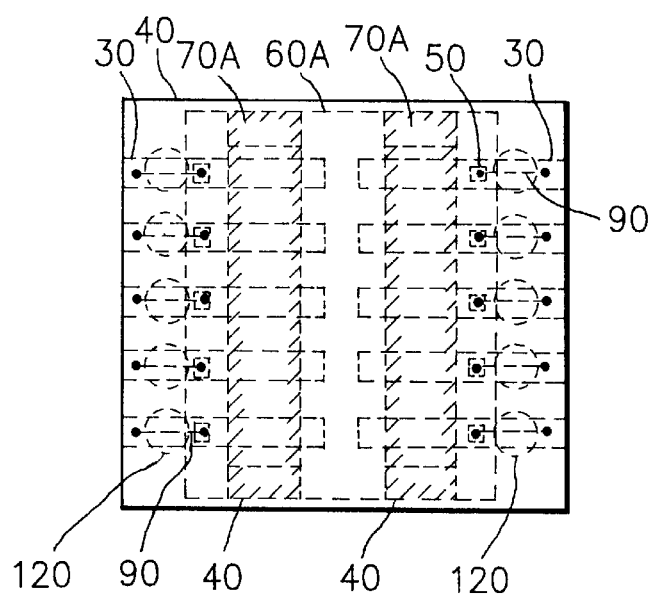
FIG. 1A is a top plan view for explaining a conventional example of a CSP type semiconductor device and a manufacturing method thereof.
Figure 1B:
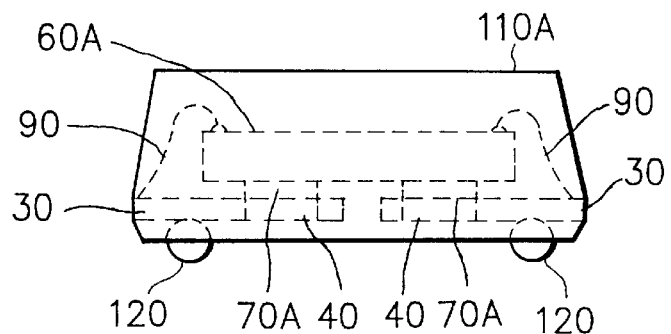
FIG. 1B is a side view for explaining the conventional example of the CSP type semiconductor device and a manufacturing method thereof.
Figure 2:
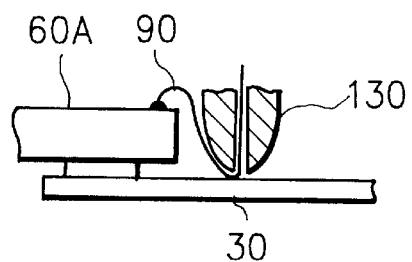
FIG. 2 is a diagram showing a structure of the conventional CSP type semiconductor device, for explaining problems of the conventional example.

Referring now to the drawings, a description of preferred embodiments of the present invention will be given in detail.

The description of a first embodiment of the present invention will be given parallel to a manufacturing process thereof.

Figure 3A:
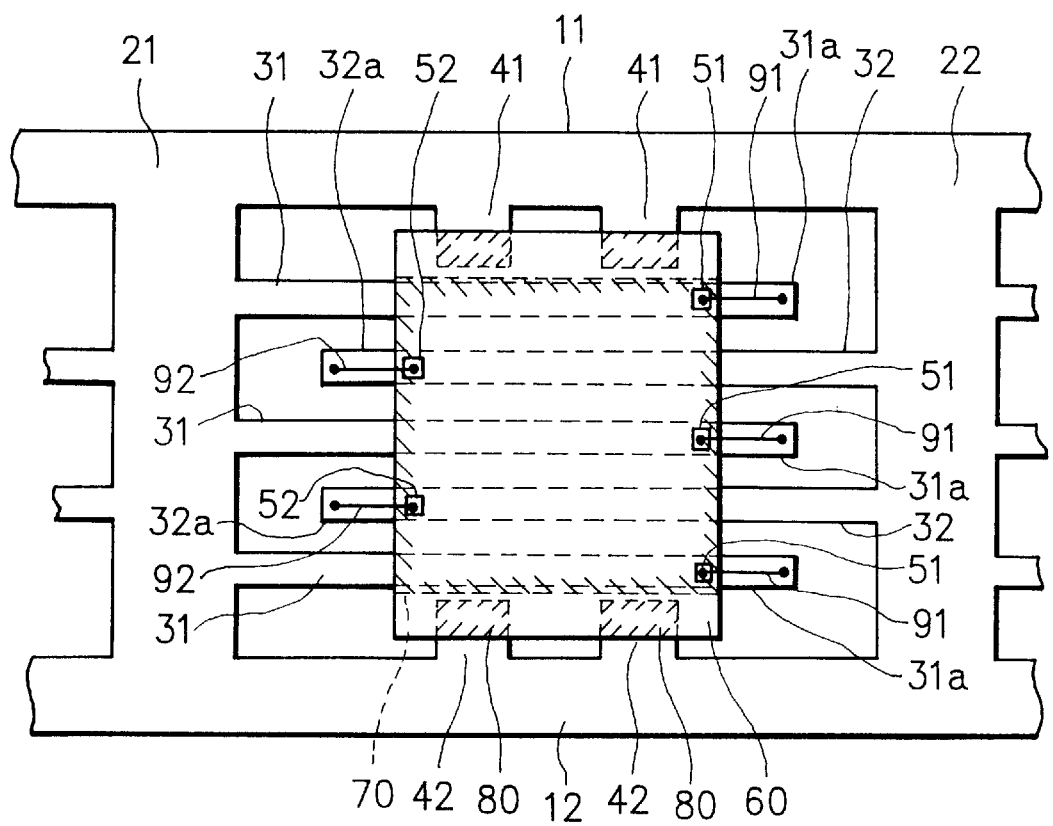
FIG. 3A is a top plan view for explaining a first embodiment of the present invention parallel to the manufacturing process thereof.
Figure 3B:
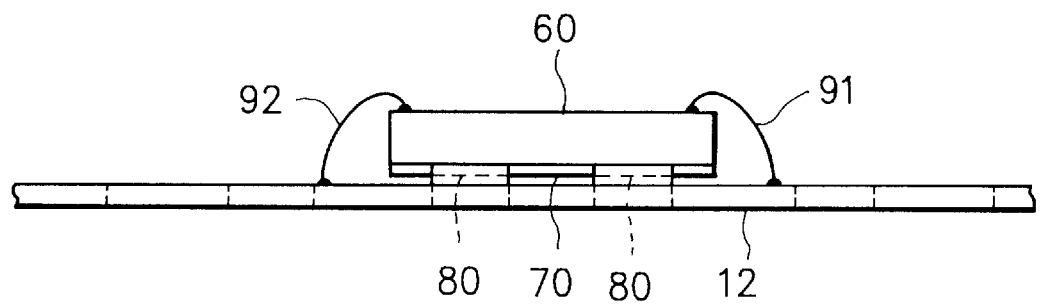
FIG. 3B is a side view for explaining the first embodiment of the present invention parallel to the manufacturing process thereof.

As can be seen in FIG. 3A and FIG. 3B, there is to be provided a lead frame including: a first frame 11 and a second frame 12 which are parallel to each other; a first tie-bar 21 and a second tie-bar 22 which are connecting the first and the second frames; first leads 31, forming first end parts 31*a* at their edge, branching from the first tie-bar 21 and stretching toward the second tie-bar 22; second leads 32, forming second end parts 32*a* at their edge, branching from the second tie-bar 22 and stretching toward the first tie-bar 21; first suspension pins 41 branching from the first frame 11; and second suspension pins 42 branching from the second frame 12.

On a main surface of a semiconductor chip 60, an electronic circuit (not illustrated) and a plurality of terminals thereof, i.e. first pads 51 and second pads 52 are formed. A back side of the main surface, where an insulating tape 70 is attached, is connected to the first suspension pins 41 and the second suspension pins 42 of the lead frame by insulating adhesive materials 80.

The first pad 51 and the second pad 52 are connected to the first end part 31*a* and the second end part 32*a* by a first wire 91 and a second wire 92, respectively, through wire bonding. In this event, it is preferable that the angles of the pad and the neighboring wire, and the lead and the neighboring wire, respectively, form an approximate right angle.

Figure 4A:
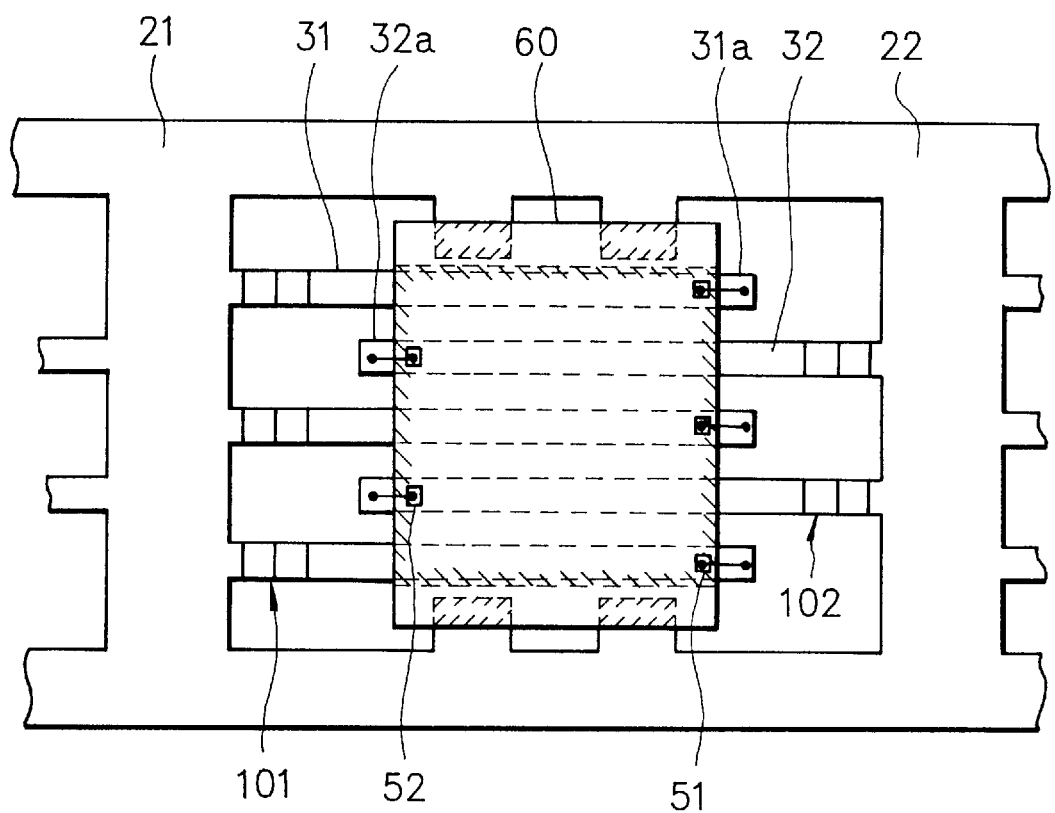
FIG. 4A is another top plan view continuing from FIGS. 3A and 3B, explaining the first embodiment of the present invention parallel to the manufacturing process thereof.
Figure 4B:
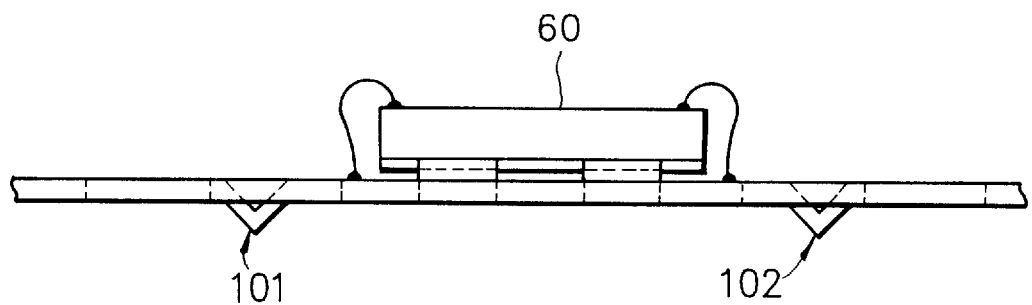
FIG. 4B is another side view continuing from FIGS. 3A and 3B, explaining the first embodiment of the present invention parallel to the manufacturing process thereof.

Then as shown in FIG. 4A and FIG. 4B, a portion of the first lead 31 at the side of the first tie-bar 21 and a portion of the second lead 32 at the side of the second tie-bar 22 are mechanically deformed to become a first bending part 101 and a second bending part 102. Consequently, the first end part 31*a* and the second end part 32*a* would move in parallel toward the semiconductor chip 60, respectively. The connecting point of each lead and wire would be at a position 50 μm–100 μm apart from the side of the semiconductor chip 60.

Figure 5A:
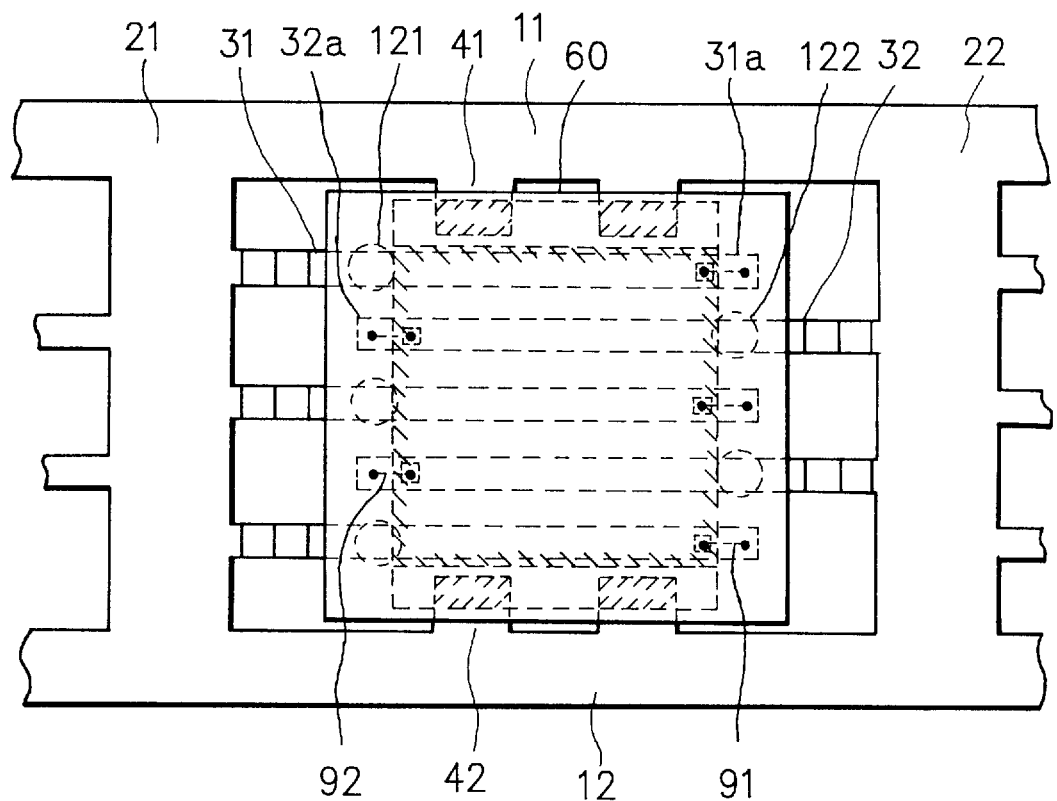
FIG. 5A is another top plan view continuing from FIGS. 4A and 4B, explaining the first embodiment of the present invention parallel to the manufacturing process thereof.
Figure 5B:
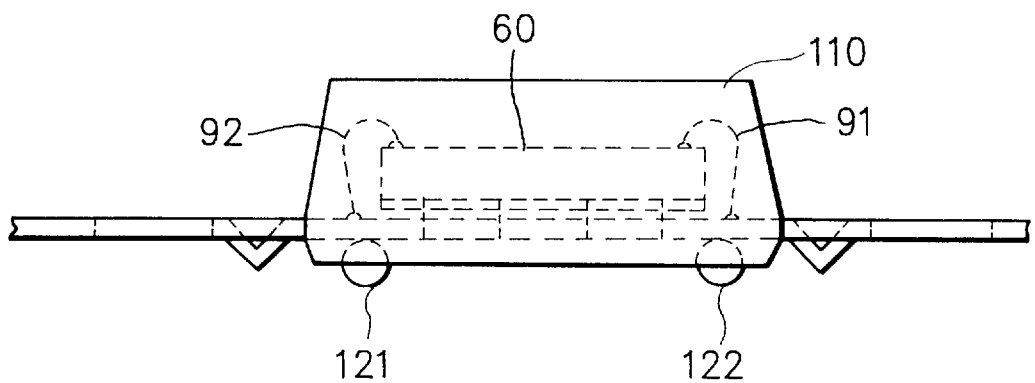
FIG. 5B is another side view continuing from FIGS. 4A and 4B, explaining the first embodiment of the present invention parallel to the manufacturing process thereof.

Then as shown in FIG. 5A and FIG. 5B, a mold resin 110 is formed as it seals: the first leads 31, the second leads 32, the first suspension pins 41, and the second suspension pins 42, with respect to portions thereof at the vicinity of the semiconductor chip 60; portions including the first end parts 31*a* and the second end parts 32*a*; the first wires 91; the second wires 92; and the semiconductor chip 60.

A certain portion of the mold resin 110 is then selectively removed so that the first leads 31 and the second leads 32 are exposed. Then first solder balls 121 and second solder balls 122 which are to connect to the first leads 31 and the second leads 32, respectively, are formed by reflow soldering or the like.

Figure 6A:
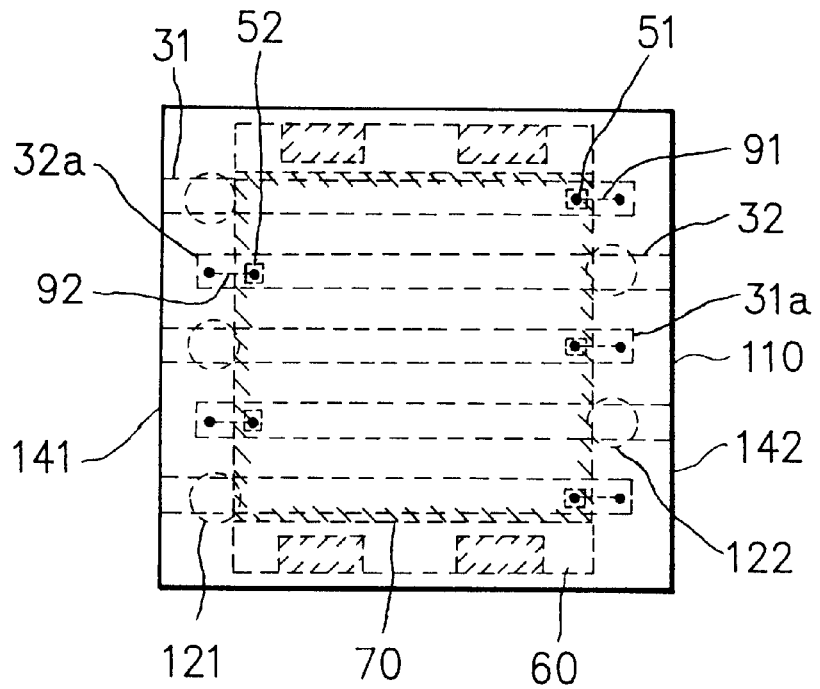
FIG. 6A is another top plan view continuing from FIGS. 5A and 5B, explaining the first embodiment of the present invention parallel to the manufacturing process thereof.
Figure 6B:
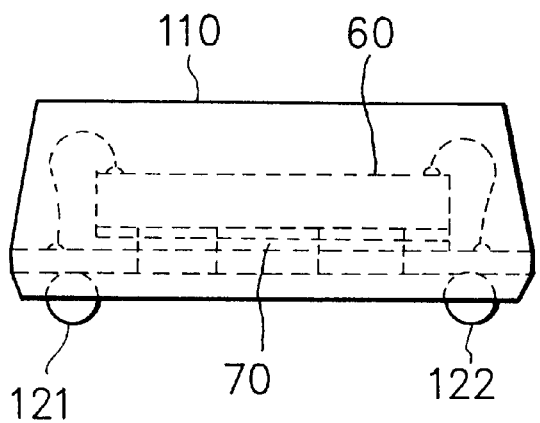
FIG. 6B is another side view continuing from FIGS. 5A and 5B, explaining the first embodiment of the present invention parallel to the manufacturing process thereof.

Finally, the first leads 31, the second leads 32, the first suspension pins 41, and the second suspension pins 42 are cut off to be separated from the first tie-bar 21, the second tie-bar 22, the first frame 11 and the second frame 12. Thus, a CSP type semiconductor device as shown in FIG. 6A and FIG. 6B are obtained.

According to the first embodiment of the present invention, the CSP type semiconductor device comprises: a semiconductor chip 60 forming an electronic circuit on a main surface thereof and a plurality of terminals, i.e. first pads 51 and second pads 52; an insulating tape 70 being attached to the back side of the main surface of the semiconductor chip 60; first leads 31 and second leads 32 each of them being arranged in parallel beneath the back side of the semiconductor chip 60 while having the insulating tape 70 applied between themselves and the semiconductor chip 60; first wires 91 and second wires 92 connecting the first pads 51 and the second pads 52 to the first leads 31 and the second leads 32, respectively; and a mold resin 110 sealing the above components with respect to certain portions. Moreover, the first leads 31 as they pass through underneath the semiconductor chip 60, stretch from a first side 141 of the mold resin 110 toward a second side 142 of the same in a way not touching it, forming first end parts 31*a* at tips thereof, the first end parts 31*a* connecting to the first wires 91. Likewise, the second leads 32 as they pass through underneath the semiconductor chip 60, stretch from the second side 142 of the mold resin 110 toward the first side 141 of the same in a way not touching it, forming second end parts 32*a* at tips thereof, the second end parts 32*a* connecting to the second wires 92. Furthermore, the first leads 31 and the second leads 32 are connected to first solder balls 121 and second solder balls 122, respectively, while the first and the second solder balls penetrate through the mold resin 110.

According to the first embodiment, followed by the bonding of the pads of the semiconductor chip with the leads by the application of wire bonding, the leads are mechanically deformed, by which the end parts of the leads where the wires are connected move in parallel toward the semiconductor chip. As a result, the end part of each lead and the side of the semiconductor chip can become closer than the time when wire bonding is executed. Consequently, even when the distances between the sides of the semiconductor chip and the sides of the mold resin are fixed, it is possible to keep a wider distance between the side of the mold resin and the connecting point of each lead and wire. Furthermore, it is possible to keep the end part of each lead not exposed from the mold resin. Because the moisture in the atmosphere is shut off by the resin, improvement on moisture resistance or wet endurance can be expected.

Next, a second embodiment of the invention will be described parallel to a manufacturing process thereof.

Figure 7A:
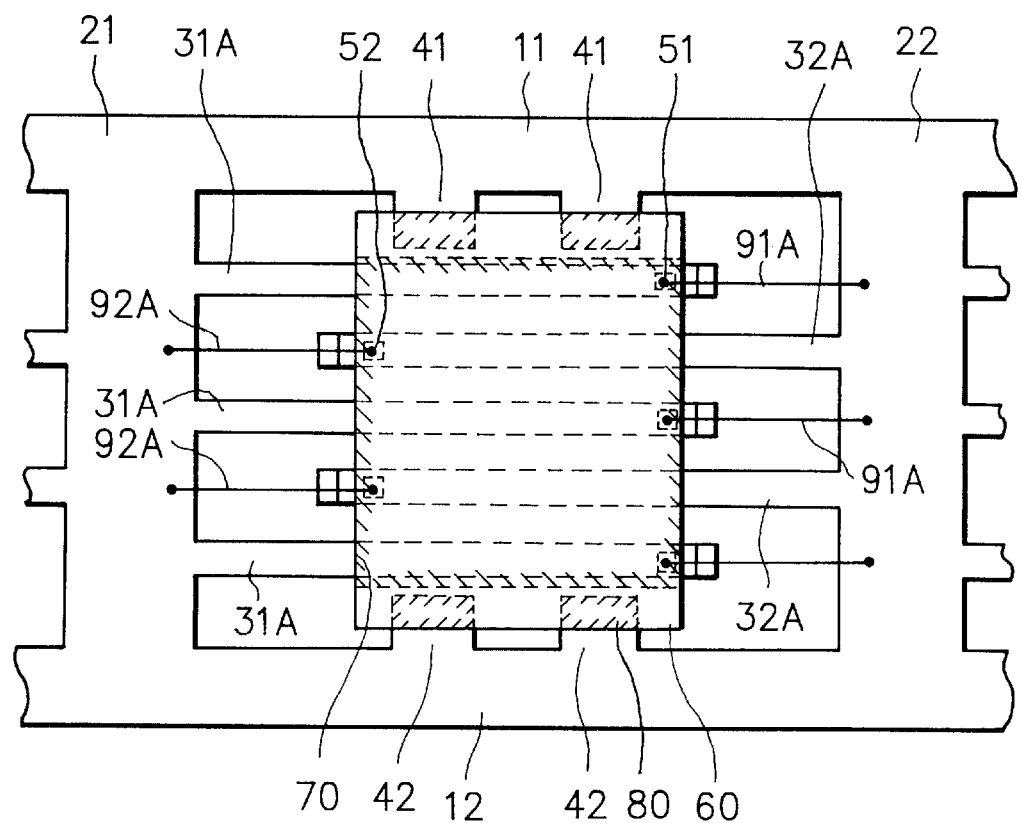
FIG. 7A is a top plan view for explaining a second embodiment of the present invention parallel to the manufacturing process thereof.
Figure 7B:
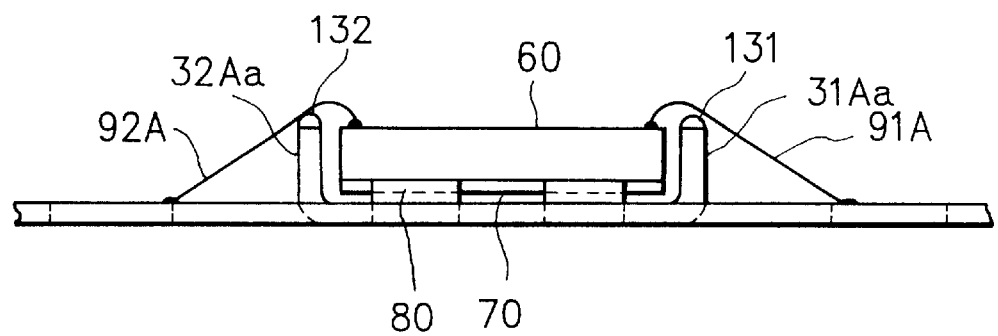
FIG. 7B is a side view for explaining the second embodiment of the present invention parallel to the manufacturing process thereof.

As can be seen in FIG. 7A and FIG. 7B, there is to be provided a lead frame including: a first frame 11 and a second frame 12 which are parallel to each other; a first tie-bar 21 and a second tie-bar 22 which are connecting the first and the second frames; first leads 31A which are branched from the first tie-bar 21, stretching toward the second tie-bar 22, bending at the edge toward the first tie-bar 21 to make an approximate right angle thus forming first end parts 31A*a*; second leads 32A which are branched from the second tie-bar 22, stretching toward the first tie-bar 21, bending at the edge toward the second tie-bar 22 to make an approximate right angle thus forming second end parts 32A*a*; first suspension pins 41 branching from the first frame 11; and second suspension pins 42 branching from the second frame 12.

On a main surface of a semiconductor chip 60, an electronic circuit (not illustrated) and a plurality of terminals thereof, i.e. first pads 51 and second pads 52 are formed. A back side of the main surface, in between the first end parts 31A*a* and the second end parts 32A*a* where an insulating tape 70 is attached, is connected to the first suspension pins 41 and the second suspension pins 42 of the lead frame through insulating adhesive materials 80. In this event, dimensions of the lead frame and the semiconductor chip 60 are determined so that the distance between the side of the semiconductor chip and the end part of each lead is between 50 μm–100 μm. Furthermore, the thickness of the first end part 31A*a* and the second end part 32A*a* is about 100 μm.

The first pads 51 and the second tie-bar 22 are then connected with wires 91A passing over the first end parts 31A*a* by an application of wire bonding. Likewise, the second pads 52 and the first tie-bar 21 are connected with wires 92A passing over the second end parts 32A*a* by an application of wire bonding.

Then by the application of reflow soldering etc. the first wire 91A and the first end part 31A*a* are connected by a solder 131, and likewise, the second wire 92A and the second end part 32Aa are connected by a solder 132. Furthermore, it is preferable that as a process preceding the reflow soldering, for example, metal such as gold, which is easily adapted to solder, is formed at tips of the first end parts 31Aa and the second end parts 32Aa before connecting the semiconductor chip.

Figure 8A:
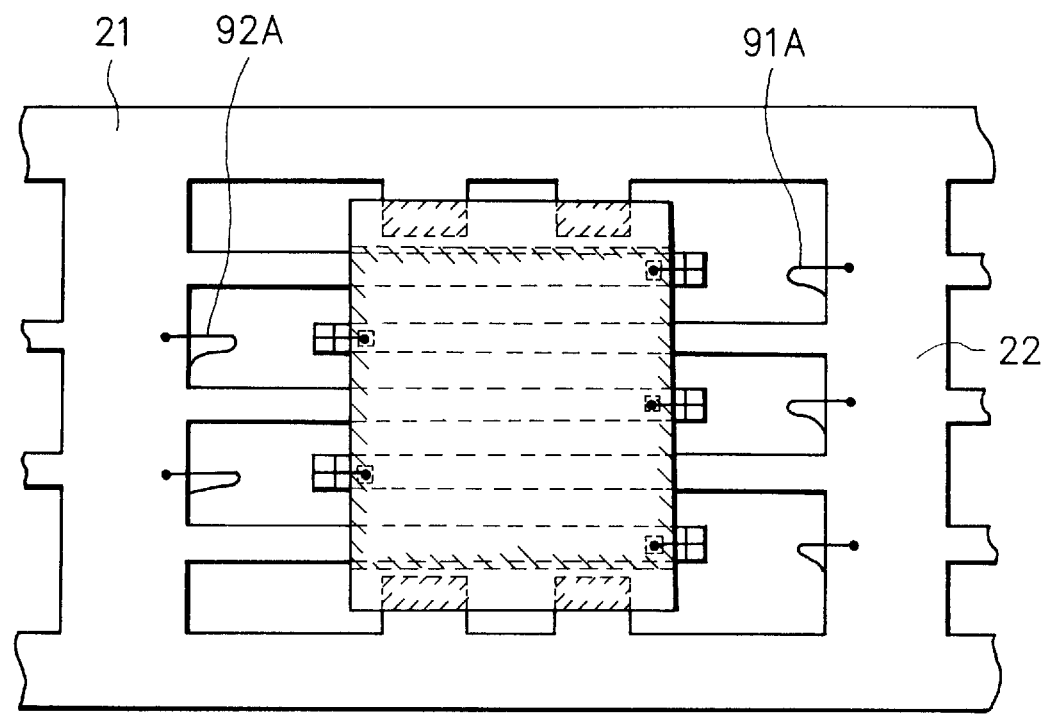
FIG. 8A is another top plan view continuing from FIGS. 7A and 7B, explaining the second embodiment of the present invention parallel to the manufacturing process thereof.
Figure 8B:
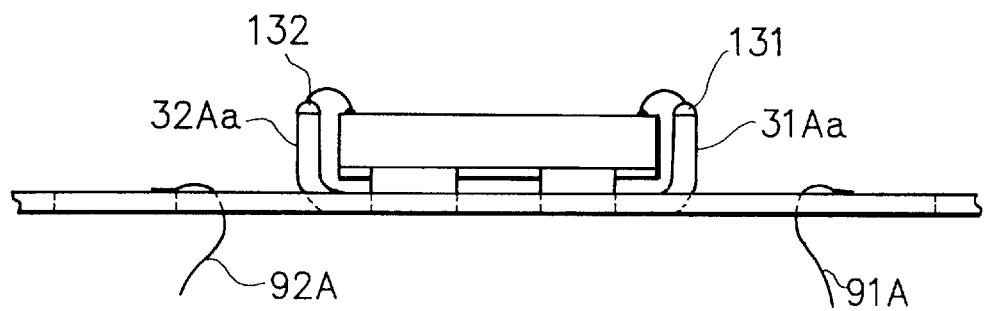
FIG. 8B is another side view continuing from FIGS. 7A and 7B, explaining the second embodiment of the present invention parallel to the manufacturing process thereof.

As shown in FIG. 8A and FIG. 8B, the first wire 91A is cut off from the soldered joint 131 of the first wire 91A and the first end part 31Aa, and likewise, the second wire 92A is cut off from the soldered joint 132 of the second wire 92A and the second end part 32Aa, such that they are separated from the second tie-bar 22 and the first tie-bar 21.

Figure 9A:
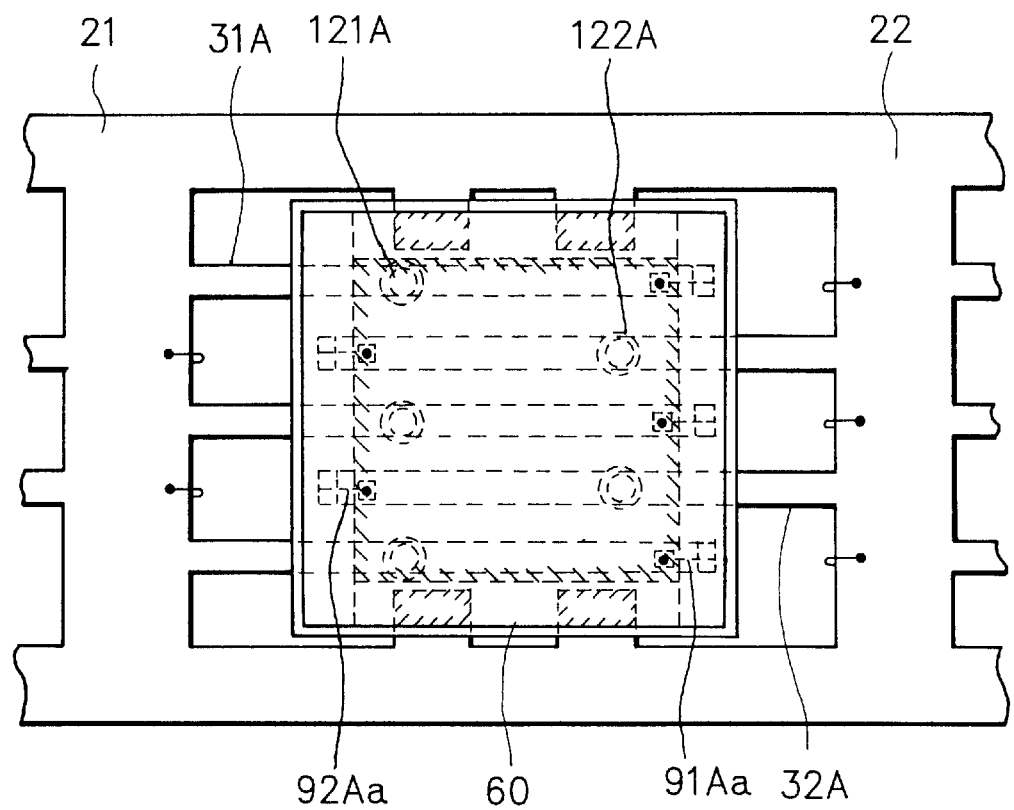
FIG. 9A is another top plan view continuing from FIGS. 8A and 8B, explaining the second embodiment of the present invention parallel to the manufacturing process thereof.
Figure 9B:
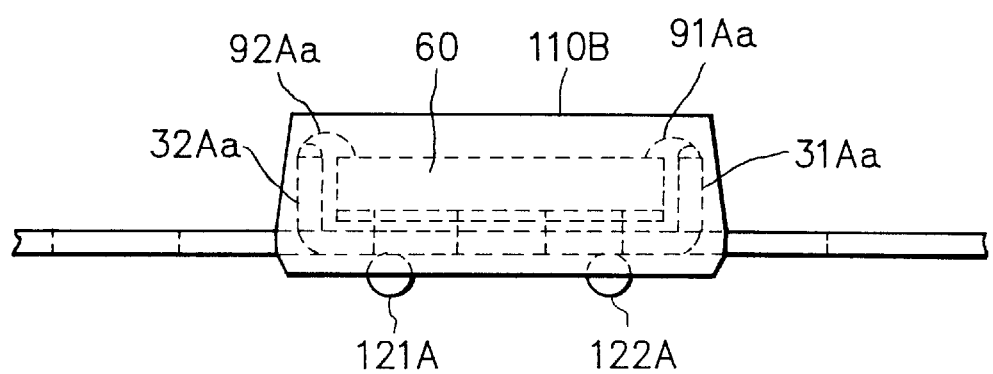
FIG. 9B is another side view continuing from FIGS. 8A and 8B, explaining the second embodiment of the present invention parallel to the manufacturing process thereof.

As shown in FIG. 9A and FIG. 9B, a mold resin 110B is formed as it seals: the first leads 31A, the second leads 32A, the first suspension pins 41, and the second suspension pins 42, with respect to portions thereof at the vicinity of the semiconductor chip 60; portions including the first end parts 31Aa and the second end parts 32Aa; the first wires 91Aa; the second wires 92Aa; and the semiconductor chip 60.

A certain portion of the mold resin 110B is then selectively removed so that the first leads 31A and the second leads 32A are exposed. Then first solder balls 121A and second solder balls 122A which are to connect to the first leads 31A and the second leads 32A, respectively, are formed.

Figure 10A:
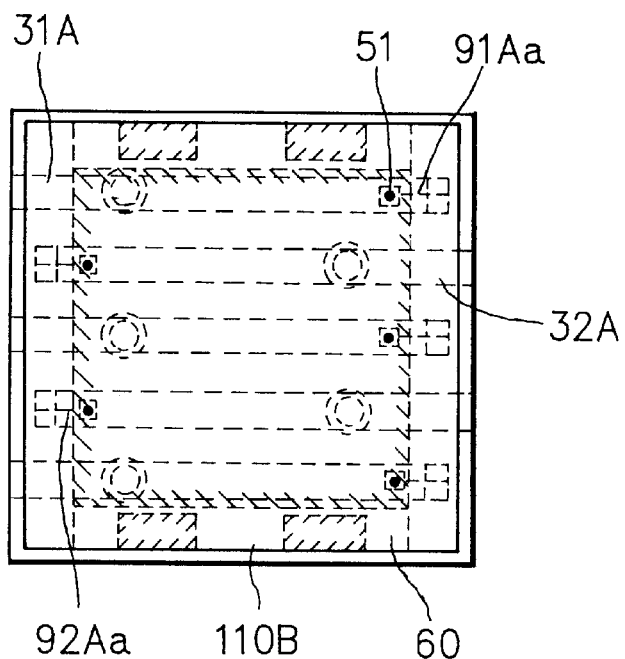
FIG. 10A is another top plan view continuing from FIGS. 9A and 9B, explaining the second embodiment of the present invention parallel to the manufacturing process thereof.
Figure 10B:
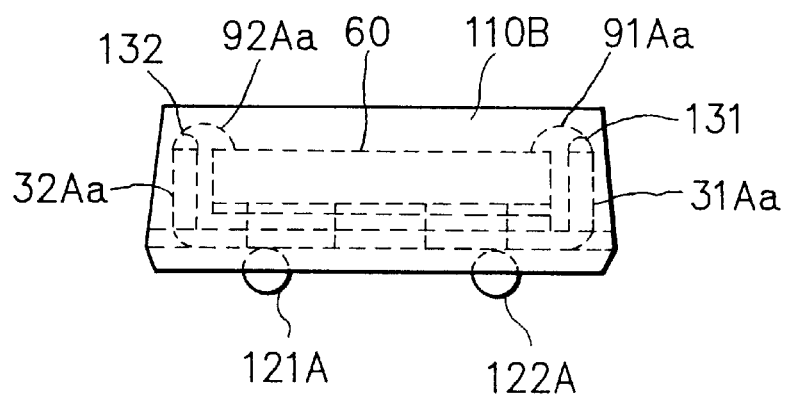
FIG. 10B is another side view continuing from FIGS. 9A and 9B, explaining the second embodiment of the present invention parallel to the manufacturing process thereof.

Finally, the first leads 31A, the second leads 32A, the first suspension pins 41, and the second suspension pins 42 are cut off to be separated from the first tie-bar 21, the second tie-bar 22, the first frame 11 and the second frame 12. Thus, a CSP type semiconductor device as shown in FIG. 10A and FIG. 10B are obtained.

According to the second embodiment of the invention, passing through underneath the semiconductor chip 60, each of the first leads 31A and the second leads 32A is bent toward the main surface of the semiconductor chip 60 where the first and the second bonding pads 51, 52 are provided. In this event, each of the first leads 31A and the second leads 32A makes an approximate right angle, as it bends. Then the first end parts 31Aa and the second end parts 32Aa are connected to the first wires 91Aa and the second wires 92Aa by the solders 131, 132, respectively. Consequently, the leads would come to the sides of the semiconductor chip, which gives an advantage that chances of possible short-circuit are lessened. Furthermore, because the length of the leads become shorter, there is given another advantage that parasitic resistance becomes smaller in view of external terminals, i.e. solder balls.

As described above, according to the present invention, the leads are moved after the leads and the wires are bonded, or the leads are previously folded and connected to the wires after the wires are bonded to the tie-bars. According to such structures, it is possible to relax limitations set by dimensions of capillaries used in wire bonding, and shorten the distance between the connecting point of each wire and lead and the side of the semiconductor chip. Accordingly, it is possible to include the end part of each lead containing such connecting point within the mold resin. As a consequence, it is possible to further improve the moisture resistance of the CSP type semiconductor device.

While preferred embodiments of the invention have been described using specific terms, such description is for illustrative purposes only, and it is to be understood that changes and variations may be made without departing from the spirit or the scope of the following claims.

What is claimed is:

1. A CSP type semiconductor device comprising:
    a semiconductor chip forming an electronic circuit on a main surface thereof and a plurality of first pads and second pads;
    an insulating tape attached to a back side of a main surface of the semiconductor chip;
    first leads and second leads arranged in parallel beneath the back side of the semiconductor chip while having the insulating tape arranged between the first and second leads and the semiconductor chip;
    first wires and second wires connecting the first pads and the second pads to the first leads and the second leads, respectively; and
    a mold resin sealing the above components with respect to certain portions,
    the first leads passing underneath the semiconductor chip, originating at and stretching from a first side of the mold resin toward a second side of the mold resin although not touching the second side, forming first end parts at tips thereof located nearer the second side than the first side, the first end parts connecting to the first wires,
    the second leads passing underneath the semiconductor chip, originating at and stretching from the second side of the mold resin toward the first side of the mold resin although not touching the first side, forming second end parts at tips thereof located nearest the first side, the second end parts connecting to the second wires,
    the first leads and the second leads connecting to first conductive balls and second conductive balls, respectively, the first and the second conductive balls penetrating through the mold resin.

2. A CSP type semiconductor device according to claim 1, wherein the whole of the first leads and the second leads are positioned lower than a plane including the back side of the semiconductor chip, the first end parts and the second end parts bonding with the first wires and the second wires, respectively.

3. A CSP type semiconductor device according to claim 1, wherein each of the first leads and the second leads is bent toward the main surface of the semiconductor chip after passing underneath the semiconductor chip, the first end parts and the second end parts of the leads being connected to the first wires and the second wires, respectively, by solder.

4. The CSP semiconductor device of claim 3, wherein a terminating end of each of the first leads and second leads is co-planar with a top surface of said semiconductor chip, the top surface being parallel to the back side.

5. The CSP semiconductor device of claim 3, wherein the first end part of each of the first leads and the second leads is parallel with a side of said semiconductor chip, the side being orthogonally to the back side.

6. The CSP semiconductor device of claim 3, wherein said first lead and second leads are located only at or above a top surface of said semiconductor chips, the top surface being parallel to the back side.

7. The CSP type semiconductor device of claim 1, wherein some of the first wires and the second wires comprise a wire portion that at a first end is connected to an associated first or second end part and has a second end located below a top surface of the semiconductor chip, which second end is connected to a wire part that points away from a nearest side of the semiconductor chip and which wire part forms an angle of greater than 90° as measured from the second end toward the semiconductor chip to an upper plane of the corresponding first or second end part, the side being orthogonally to the back side, the top surface being parallel to the back side.

8. The CSP semiconductor device of claim 1, wherein the first leads are exposed through the mold resin at the first side.

* * * * *